(12) United States Patent
Katoh

(10) Patent No.: US 8,581,599 B2
(45) Date of Patent: Nov. 12, 2013

(54) INSPECTION PIN PROTECTION STRUCTURE OF CONDUCTION CHECK APPARATUS

(75) Inventor: Hideyuki Katoh, Gotemba (JP)

(73) Assignee: Yazaki Corporation, Tokyo (JP)

( * ) Notice: Subject to any disclaimer, the term of this patent is extended or adjusted under 35 U.S.C. 154(b) by 542 days.

(21) Appl. No.: 12/810,534

(22) PCT Filed: Dec. 26, 2008

(86) PCT No.: PCT/JP2008/073973
§ 371 (c)(1),
(2), (4) Date: Jun. 25, 2010

(87) PCT Pub. No.: WO2009/084735
PCT Pub. Date: Jul. 9, 2009

(65) Prior Publication Data
US 2010/0271043 A1      Oct. 28, 2010

(30) Foreign Application Priority Data

Dec. 28, 2007   (JP) .................................. 2007-341197

(51) Int. Cl.
*G01R 31/04*   (2006.01)

(52) U.S. Cl.
USPC .......... 324/538; 324/750.2; 439/71; 439/266; 439/310; 439/342

(58) Field of Classification Search
USPC ........................................................ 324/538
See application file for complete search history.

(56) References Cited

U.S. PATENT DOCUMENTS

| | | | | |
|---|---|---|---|---|
| 4,862,313 A | * | 8/1989 | Shirouzu et al. | 361/102 |
| 5,663,655 A | * | 9/1997 | Johnston et al. | 324/750.25 |
| 5,800,194 A | * | 9/1998 | Yamagishi | 439/266 |
| 5,801,543 A | * | 9/1998 | Keune et al. | 324/750.2 |
| 5,945,838 A | * | 8/1999 | Gallagher et al. | 324/750.25 |
| 6,749,443 B2 | * | 6/2004 | Sano et al. | 439/71 |

(Continued)

FOREIGN PATENT DOCUMENTS

| | | | |
|---|---|---|---|
| JP | 2001135441 A | * | 5/2001 |
| JP | 2002-343527 A | | 11/2002 |
| JP | 2004-037164 A | | 2/2004 |

OTHER PUBLICATIONS

International Search Report [PCT/ISA/210] issued Apr. 7, 2009, in PCT/JP2008/073973.

(Continued)

*Primary Examiner* — Melissa Koval
*Assistant Examiner* — Benjamin M Baldridge
(74) *Attorney, Agent, or Firm* — Sughrue Mion, PLLC

(57) ABSTRACT

A conduction check apparatus including an inspection part (4) having a main body (22) having a surface (23a), inspection pins (21) protruded from the surface (23a), a guide pin (8) provided on the surface (23a); and a protection board 6 sliding along the guide pin (8) from a first position to a second position and having a plurality of holes (28). At the first position, the protection board (6) covers a tip of each of the inspection pins (21) and, at the second position, each of the inspection pins (21) jut out from the respective one of the holes (28). The conduction check apparatus includes a connector setting part (3) relatively moving toward the inspection part (4). The protection board (6) moves between the first and the second position during the relative movement.

10 Claims, 4 Drawing Sheets

(56) References Cited

U.S. PATENT DOCUMENTS

| | | | |
|---|---|---|---|
| 7,128,587 B2* | 10/2006 | Eldridge et al. | 439/136 |
| 7,172,450 B1* | 2/2007 | Sylvia et al. | 439/342 |
| 2003/0162430 A1* | 8/2003 | Shinzou et al. | 439/310 |
| 2005/0155180 A1* | 7/2005 | Lin | 16/287 |
| 2007/0005287 A1* | 1/2007 | Zhang et al. | 702/119 |
| 2007/0092285 A1* | 4/2007 | Oguma et al. | 399/90 |
| 2007/0131881 A1* | 6/2007 | Kim et al. | 250/559.45 |
| 2007/0169592 A1* | 7/2007 | Putsch | 81/408 |

OTHER PUBLICATIONS

Written Opinion [PCT/ISA/237] issued Apr. 7 2009, in PCT/JP2008/073973.

* cited by examiner

INSPECTION PIN PROTECTION STRUCTURE OF CONDUCTION CHECK APPARATUS

TECHNICAL FIELD

The present invention relates to an inspection pin protection structure of a conduction check apparatus, which protects an inspection pin to be abutted against a terminal of a connector to check conduction of the connector with a protection board from external interference or the like.

BACKGROUND ART

FIGS. 4A and 4B illustrate an example of a conventional conduction check apparatus.

This conduction check apparatus 61 includes an inspecting part 64 having a plurality of pins 63 for checking conduction of a connector 62, a connector setting part 65 for setting the connector 62 therein, a frame 66 for slidably arranging the inspecting part 64 and for fixedly arranging the setting part 65, and a lever 67, rotatably provided on the frame 66 so as to advance and retreat the inspecting part 64 to the setting part 65.

Further, an inspection pin adjusting plate 69 is disposed in a front-side opening 68 of the inspecting part 64 and is frontwardly urged by upper and lower coils 70. At a non-test time illustrated in FIG. 4A, a tip of each inspection pin 63 is disposed in an associated one of holes 71 of the adjusting plate 69. At a test time illustrated in FIG. 4B, each inspection pin 63 is passed through an associated one of the holes 71 and is contacted with an associated one of female terminals 72 in the connector 62 while the adjusting plate 69 is retreated by being pushed with a rear end surface 62a of the connector 62. The adjusting plate 69 serves also as a protection board that protects the inspection pin 63 from external interference.

Each inspection pin 63 is frontwardly urged by a coil spring 73 in the inspecting part 64. Each inspection pin 63 is connected to an electric wire (not shown) which is connected to an electrical conduction determination apparatus (not shown). Electric wires 74 led out of the connector 62 are similarly connected to the conduction determination apparatus. Thus, the qualities of the connection and electrical conduction between the terminals 72 and the electric wires 74 are checked.

The connector 62 is made of an insulating resin connector housing and each female terminal 62 with an electric wire housed in a terminal housing chamber of the connector housing. Each terminal 72 is locked by a flexible locking lance 75.

Such a conventional conduction check apparatus is described in JP-A-2004-37164 (FIGS. 2 and 3) for example.0

However, in the conventional conduction check apparatus 61, as the rear end 62a of the connector 62 abuts against the adjusting plate 69, an inclination of the adjusting plate 69 is tend to occur depending on the position of the connector 62 in the setting part 65 or the variation of the angle of rear end surface 62a. In this case, there are fears that the inspection pin 63 may interfere with the hole 71 of the adjusting plate 69, that the adjusting plate 69 cannot smoothly retreat, and that the inspection pin 63 may wear. These fears might be compounded by the fact that the compression coil springs 70 are respectively supported between the adjusting plate 69 and a back wall 76 of the inspecting part 64 by protrusions 77 that anteroposteriorly extend. Further, at the time of the shortening (i.e., compactification) of the inspecting part 64, due to variation in the entire length of the connector 62, there is a fear that the protrusions 77 may be in abutment contact with each other, so that a forced compressing force (bending force) may act upon the adjusting plate 69, when the adjusting plate 69 maximally compresses the coil spring 70, that is at the time of maximally retreating the adjusting plate 69 illustrated in FIG. 4B, i.e., at the conduction checking of the connector 62.

In view of the aforementioned problems, an object of the invention is to provide an inspection pin protection structure of a conduction check apparatus that can smoothly advance and retreat the protection board without inclining the protection board when the adjusting plate is used as the protection board for the inspection pin. In addition, an object of the invention is to provide an inspection pin protection structure of a conduction check apparatus that performs a conduction inspection without causing a bending force to act upon the protection board at the conduction inspection of a connector.

DISCLOSURE OF THE INVENTION

To achieve the foregoing object, the present invention provides the following conduction check apparatus. The first configuration of the conduction check apparatus of the invention is provided as a conduction check apparatus for inspecting a connector conduction which includes an inspection part having a main body having a surface, a plurality of inspection pins protruded from the surface, a guide pin provided on the surface, and a protection board sliding along the guide pin from a first position to a second position and having a plurality of holes. At the first position, the protection board covers a tip of each of the inspection pins. At the second position, each of the inspection pins jut out from the respective one of the holes. In addition, the conduction check apparatus of the invention includes a connector setting part relatively moving toward the inspection part. The protection board moves between the first and the second position during the relative movement.

Preferably, in the conduction check apparatus according to the above configuration, the guide pin is parallel to the inspection pins.

Preferably, in the conduction check apparatus according to the above configuration, the connector setting part has a first side wall and a second side wall so as to have a U-shape.

Preferably, in the conduction check apparatus according to the above configuration, the connector setting part has a rear end surface facing to the protection board and coming into contact with the protection board during the relative motion.

Preferably, in the conduction check apparatus according to the above configuration, the inspection part includes an urging member which urges the protection board from the second to the first position.

Preferably, in the conduction check apparatus according to the above configuration, the protection board has a guide hole through which the guide pin is mounted.

Preferably, in the conduction check apparatus according to the above configuration, the guide pin has a thick portion at a tip of the guide pin and the thick portion has a larger cross section than other part of the guide pin along which the protection board slides.

Preferably, in the conduction check apparatus according to the above configuration, the urging member is a spring winding the guide pin. In addition, the surface has a space at a root of the guide pin in which the spring is accommodated at the second position.

According to the above configuration, a connector is set in the connector setting part, the inspection part advances to the connector, the protection board abuts against the connector setting part, preferably, against the rear end surface of the connector setting part, the spring is compressed and the protection board slidingly retreats along to the guide pin, and then the protection board is sandwiched (i.e., supported by being sandwiched) between the surface of the inspecting part and each of the rear end surfaces of the pair of both the side walls. Simultaneously, each inspection pin passes through an associated one of the hole of the protection board and is contacted with a terminal in the connector. Thus, a conduction of the connector is checked.

The front end surface of the protection board abuts against the rear end surfaces of the connector setting part by being surface-contacted therewith. Thus, the protection board is prevented from being tilted (or inclined). Interference between each holes of the protection board and an associated one of the inspection pins and abrasion and deformation thereof, which are caused by the interference, are prevented. The protection board advances and retreats along the guide pin. Thus, the protection board is prevented from being tilted (or inclined). Consequently, similar advantages are obtained. Further, the protection board is sandwiched between the connector setting part and the inspecting part. Thus, the protection board is surely prevented from being tilted (or inclined). In addition, bending-deformation or the like of the protection board is prevented.

The second configuration of the conduction check apparatus according to the first configuration is of the invention is a conduction check apparatus further includes a lever connected to the inspection part through a divided link. The divided link includes a first link connected to the inspection part, a second link connected to the lever, and an elastic member connecting the first and the second link.

According to the above configuration, at the conduction check of a connector, the protection board abuts against the rear end surface of the connector setting part and is sandwiched between the rear end surface of the connector setting part and the front end surface of the inspecting part. Simultaneously, the pair of divided link-members becomes closer to each other against an urging force of each of the springs, so that the length of the link is shortened. Thus, the protection board is prevented from being more compressed. Consequently, an excessive compressing force is prevented from acting upon the protection board. In addition, an excessive compression load due to variation in the dimensions of each member is prevented from being applied to the protection board.

According to the first configuration of the inspection pin protection structure of the invention, at the conduction inspection of a connector, the front end surface of the protection board is made to abut against the rear end surface of each of the pair of both the side walls of the connector setting part. Thus, the protection board can be prevented from being tilted (or inclined). The interference between each hole of the protection board and an associated one of the inspection pins and abrasion and deformation thereof, which are associated with the interference, can be prevented. Further, the protection board is caused to advance and retreat along the guide pin. Thus, similarly, the protection board is prevented from being tilted (or inclined). The interference between each hole of the protection board and an associated one of the inspection pins and abrasion and deformation thereof, which are associated with the interference, can be prevented. Furthermore, at the inspection of conduction of a connector, the protection board is sandwiched between the connector setting part and the inspecting part. Thus, the protection board can be prevented from being tilted (or inclined). The interference between each hole of the protection board and an associated one of the inspection pins and abrasion and deformation thereof, which are associated with the interference, can be prevented. In addition, bending-deformation or the like of the protection board and breakage associated therewith can be prevented.

According to the second configuration of the inspection pin protection structure of the invention, at the inspection of conduction of a connector, the protection board is made to abut against the rear end surface of the connector setting part. The protection board is sandwiched between the front end surface of the inspecting part and the rear end surface of the connector setting part. Simultaneously, the length of the link is reduced. Thus, an excessive compressing force can be prevented from acting upon the protection board. In addition, an excessive compression load due to variation in the dimensions of each member is prevented from being applied to the protection board. Consequently, a conduction inspection can be performed smoothly and surely.

BRIEF DESCRIPTION OF THE DRAWINGS

FIG. 3A is a front view of this embodiment when a connector is set therein. FIG. 3B is front view of this embodiment when a conduction test is performed thereon.

FIG. 4A is a longitudinally cross-sectional view illustrating this example of the conduction check apparatus when a connector is set therein. FIG. 4B is a longitudinally cross-sectional view illustrating this example of the conduction check apparatus when a conduction test is performed thereon.

BEST MODE FOR CARRYING OUT THE INVENTION (Embodiment 1)

Figure 1:
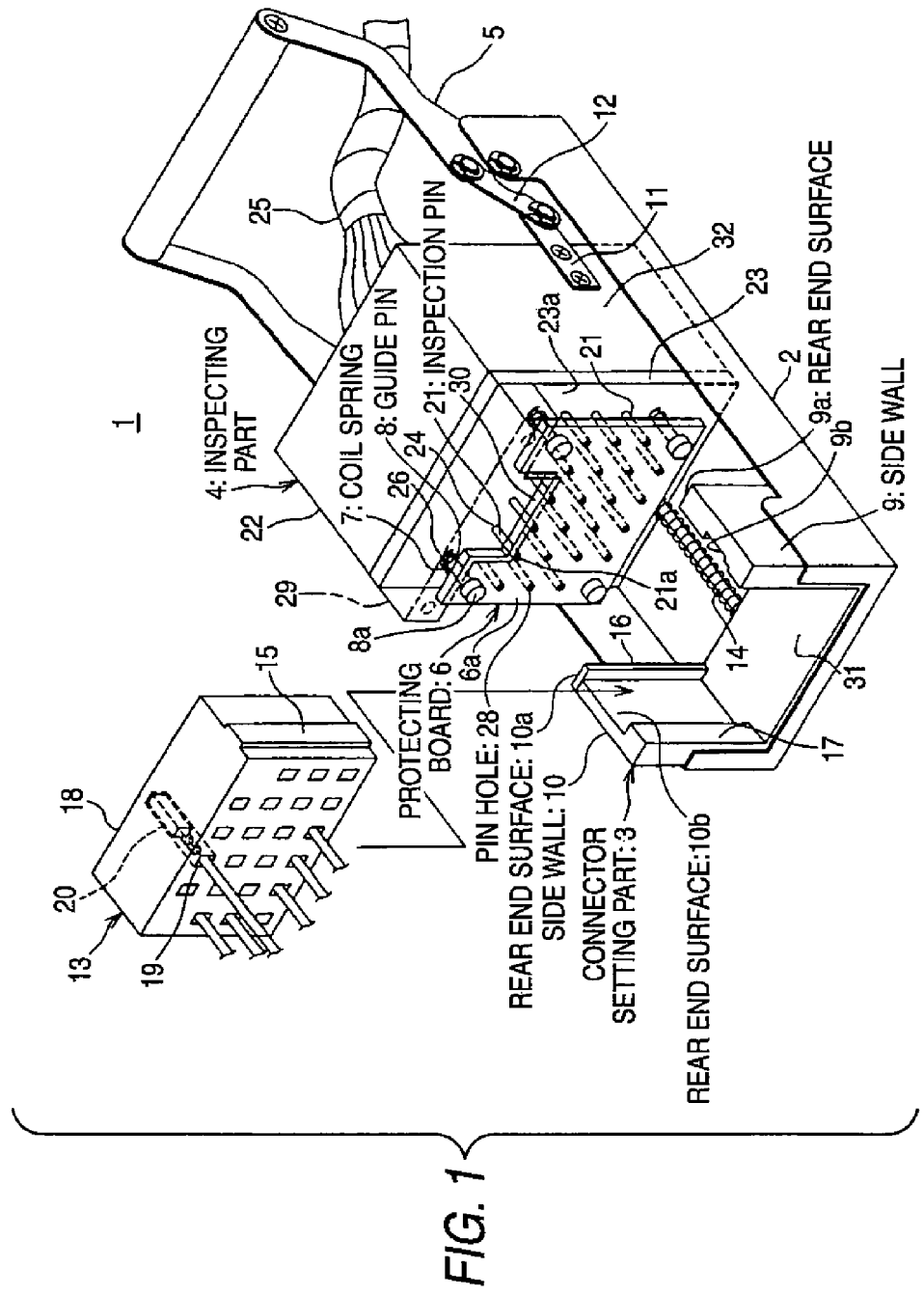
FIG. 1 is an exploded perspective view illustrating an embodiment of a inspection pin protection structure of a conduction check apparatus according to the invention when a connector is set therein.
Figure 2:
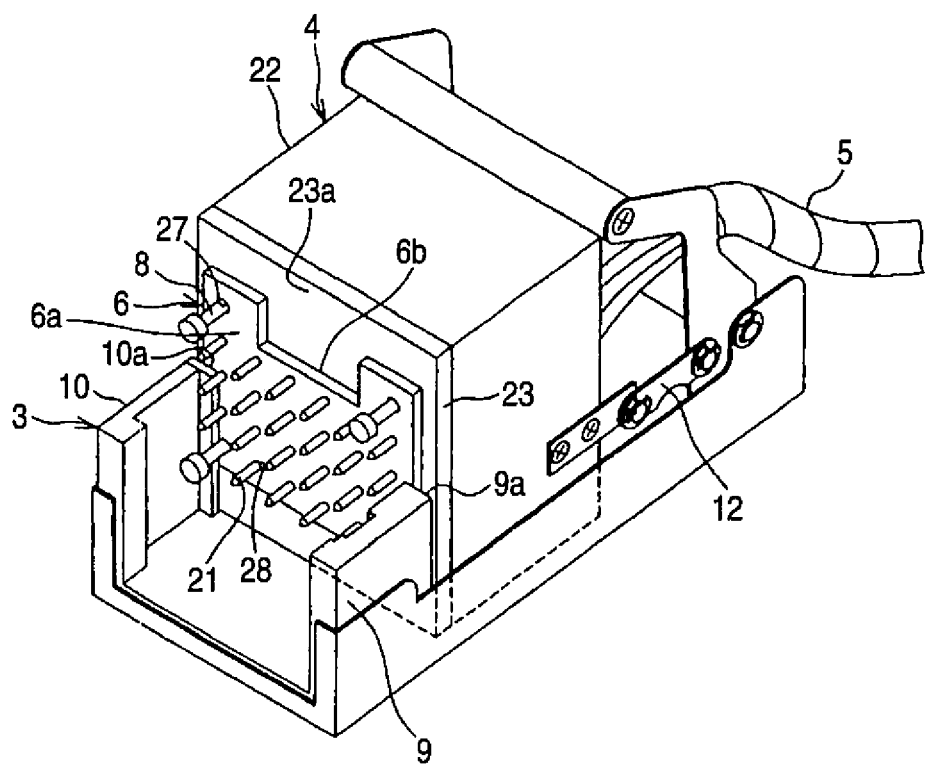
FIG. 2 is an exploded perspective view illustrating the embodiment of the inspection pin protection structure of the conduction check apparatus according to the invention when a conduction test is performed (the drawing of the connector is omitted).

FIGS. 1 and 2 illustrate an embodiment of an inspection pin protection structure of a conduction check apparatus according to the invention.

In the conduction check apparatus shown in FIGS. 1 and 2, a connector setting part 3 is fixedly mounted on the front side of a frame 2, a inspecting part 4 is mounted on the frame 2 and is slidable along the inner side of the frame 2 according to a lever 5 operation, and a protecting board 6 is mounted on the front side of the inspecting part 4 with being urged by a compressing coil spring 7. The protecting board 6 is made of insulating resin and has a rectangular shape. The front end surface 6a of the protection board abuts against rear end surface 9a and 10a of the connector setting part 3.

FIG. 1 illustrates a state before a connector 13 is set in the connector setting part 3. FIG. 2 illustrates a state at a conduction check, in which the protection board 6 is made to abut against the setting part 3 in a connector set condition (the drawing of the connector 13 is omitted in FIG. 2).

As illustrated in FIG. 1, the frame 2 is formed of a metal plate. The setting part 3 is fixed to the inner side of the frame 2 by screwing or the like. The inspecting part 4 is slidable along the inner side of the frame 2 and a horizontal guide shaft 14 provided between the inspecting part 4 and the setting part 3.

The setting part 3 is formed of a synthetic resin into U-shape. The setting part 3 has a narrow longitudinal groove 9b provided in one side wall 9, with which a projecting ridge 15 formed on one side surface of the connector 13 is engaged, and a wide longitudinal groove 10b provided in the other side wall 10, with which the other side surface of the connector 13 is engaged. The wide longitudinal groove 10b is formed between a metal flange plate 16 formed at a rear end thereof and a flange portion 17 formed at a front end. A rear end surface 10a of the flange plate 16 and a rear end surface 9a of the one side wall 9 are located on the same vertical plane, as viewed in FIG. 1, and can simultaneously abut against a protection board 6 at the side of the inspecting part 4. The flange plate 16 is fixed to the side wall 10 by screwing. The formation of the longitudinal groove 10b is facilitated by the flange plate 16. In addition, an abutment surface (rear end surface) 10a opposed to the protection board 6 is reinforced. Thus, the protection board 6 can surely be received in surface contact therewith. The flange plate 16 is a part of the side wall 10.

The connector 13 includes an insulating resin connector housing 18, and metallic female terminals 20 with electric wires, which are inserted into terminal accommodating chambers of the connector housing 18 from front openings 19, respectively. A rear opening (not shown) of each terminal accommodating chamber is narrower than the front opening 19 thereof. A mating terminal (not shown) of a mating connector and an inspection pin 21 of the inspecting part 4 can be inserted into the rear opening of each terminal accommodating chamber. In the present specification, it is assumed that the anteroposterior direction of the connector 13 coincides with that of the conduction check apparatus 1.

The inspecting part 4 includes a body 22 which is made of an insulating synthetic resin and is formed like a box, and a plurality of parallel metal inspection pins 21 arranged in the body 22 from side to side and up and down. The body 22 has a vertical plate wall 23 at the front end thereof, as viewed in FIG. 1. Each of the inspection pins 21 is frontwardly protruded from an associated one of holes 24 of the plate wall 23. Each of the inspection pins 21 has a small-diameter compressing coil spring (not shown) provided therein and is stretchable by a predetermined length of strokes. The rear end of each of the inspection pins 21 is connected to an associated one of electric wires 25. The electric wires 25 are bundled and connected to a conduction determination apparatus (not shown).

Guide pins 8 are respectively protruded frontwardly from the hole 26 arranged in the plate wall 23 from side to side and up and down. Guide hole 27 (see FIG. 2) of the protection board 6 slidably engage with the guide pins 8, respectively. Compressing coil springs 7 are elastically contacted with the guide pins 8 between the body 22 and the protection board 6, respectively. The rear end portions of the coil springs 7 enter the hole 26 of the plate wall 23, respectively. The front end surface 6a of the protection board 6 is pushed against the rear end surface of a large-diameter front end head portion 8a of each of the guide pins 8 by a force of an associated one of the coil springs 7. The protection board 6 is configured to be retreatable along the guide pins 8 while the protection board 6 abuts against the both side rear end surfaces 9a and 10a of the setting part 3.

A front end 21a of each of the guide pins 8 is accommodated and protected in an associated one of small-diameter pin hole 28 of the protection board 6. The guide wall 29 of the inspecting part 4 is disposed above the protection board 6 so as to protrude frontwardly from the protection board 6. An upper portion of the protection wall 6 has a rectangular cutout portion 30 through which a downward protrusion portion provided at a central portion of the guide wall 29 is passed. The guide wall 29 restricts a position in an up-down direction of the connector 13 by covering the top surface of the connector 13 at the conduction check illustrated in FIG. 2. The head portion 8a of each of the guide pins 8 is positioned slightly inwardly from the both side rear end surfaces 9a and 10a so as not to abut against both the rear end surfaces 9a and 10a of the setting part 3. The plate wall 23 is formed to have the same cross-section as that of the body 22 of the inspecting part 4. The protection board 6 is formed so as to be size smaller than the plate wall 23 and as to be extended above the top of the setting part 3.

A guide shaft 14 is placed under the protection board 6. One end of the guide shaft 14 is fixed to a bottom wall 31 of the setting part 3. The other end of the guide shaft 14 is slidably inserted into the inspecting part 4. A fixed link 11 is horizontally fixed to the rear portion of each of both side walls 32 of the inspecting part 4. The lever 5 is axially supported by the frame 2, so that a movable link 12 is axially supported between the fixed link 11 and the lever 5 aslope.

FIG. 1 illustrates a state in which the lever 5 is rearwardly turned. In this state, the connector 13 is set in the setting part 3. When the lever 5 is frontwardly turned as illustrated in FIG. 2, the inspecting part 4 advances with the movable link 12 horizontally turning. Both side portions of the front end surface 6a of the protection board 6 abut against both side rear end surfaces 9a and 10a of the setting part 3 by being surface contacted therewith. Then, the inspecting part 4 further advances. Thus, the coil springs 7 (FIG. 1) are maximally compressed and are accommodated in the hole 26 of the plate wall 23 (FIG. 1), respectively. The guide pins 8 advance integrally with the inspecting part body 22 so as to protrude frontwardly from the protection board 6. Thus, the protection board 6 is sandwiched between the setting part 3 and the plate wall 23. The front end surface 6a of the protection board 6 abuts against both side rear end surfaces 9a and 10a of the setting part 3 at left side and right side outwardly from the connector 13. The rear end surface 6b of the protection board 6 abuts against the front end surface 23a of the plate wall 23. The front end surface 6a of the protection board 6 abuts against the rear end surfaces 9a and 10a of the setting part 3. Simultaneously, the rear end surface of the connector 13 can abut against the front end surface 6a of the protection board 6.

Each of the inspection pins 21 protrudes frontwardly from an associated one of the pin hole 28 of the protection board 6 integrally with an associated one of guide pins 8, and enters an associated one of terminal accommodating chambers from an associated one of rear openings (not shown) of the connector 13 in the setting part 3. Then, each of the inspection pins 21 is elastically contacted with, e.g., the front end portion of a female terminal 20 (FIG. 1) in the associated one of the terminal accommodating chambers. In this state, a conduction inspection of the terminal 20 is performed.

At the conduction check, both side portions of the front end surface 6a of the protection board 6 abut against the rear end surfaces 9a and 10a of both side walls 9 and 10 of the setting part 3 by being surface-contacted therewith. Thus, the protection board 6 is prevented from being tilted. Interference between the inspection pins 21 and the pin hole 28 of the protection board 6, and abrasion and bending-deformation, which are associated with the interference, are prevented. Further, the tilting of the protection board 6 can be prevented also by causing the protection board 6 to slide along the guide pins 8 arranged from side to side and up and down against urging by the springs 7 (FIG. 1). Consequently, the aforementioned advantages can be promoted.

Further, at the conduction check, the rear end surface 6b of the protection board 6 is pushed against the plate wall 23, which is the front wall of the inspecting part 4, by being surface-contacted therewith. Thus, the protection board 6 is surely prevented from being tilted. In addition, a bending force does not act upon the protection board 6. Consequently, the bending-deformation of the protection board 6 and the interference between the pin hole 28 of the protection board 6 and the inspection pins 21, which are associated with the bending-deformation of the protection board 6, are prevented.

As illustrated in FIG. 1, the inspecting part 4 is slidingly retreated by rearwardly turning the lever 5 from the inspected state illustrated in FIG. 2. The protection board 6 is spaced apart along the guide pins 8 frontwardly from the plate wall 23 by an urging force of the springs 7. Subsequently, the protection board 6 is spaced apart rearwardly from the setting part 3. The inspection pins 21 are retreated along the pin hole 28 of the protection board 6. The leading ends (or front ends) of the inspection pins 21 are accommodated and protected in the pin hole 28, respectively. In this state, the inspected connector 13 is taken out of the setting part 3.

Incidentally, a situation where there is only a small space, in which no finger can be inserted, between the front end surface 23a of the inspecting part 4 and each of the rear end surfaces 9a and 10a of the connector setting part 3 is possible, when the inspecting part 4 is maximally retreated as illustrated in FIG. 1. In this case, the protection board 6 can be provided by being fixed between the rear ends 9a and 10a of the setting part 3, so that the leading end (front end) 21a of each of the inspection pins 21 frontwardly protruded from the front end surface 23a of the inspecting part 4 is accommodated in an associated one of the pin hole 28 of the protection board 6 when the inspecting part 4 is maximally retreated.

In this case, at the conduction check illustrated in FIG. 2, the front end surface 23a of the plate wall 23, which is the front end surface of the inspecting part 4, abuts against the rear end surface 6b of the protection board 6. Each of the inspection pins 21 frontwardly penetrates through an associated one of the pin hole 28 of the protection board 6 and is contacted with the female terminal 20 of the connector 13 in the setting part 3. The protection board 6 is fixed to each of the rear ends 9a and 10a of both side walls 9 and 10 of the setting part 3 by screwing or the like.

(Embodiment 2)

Figure 3A:
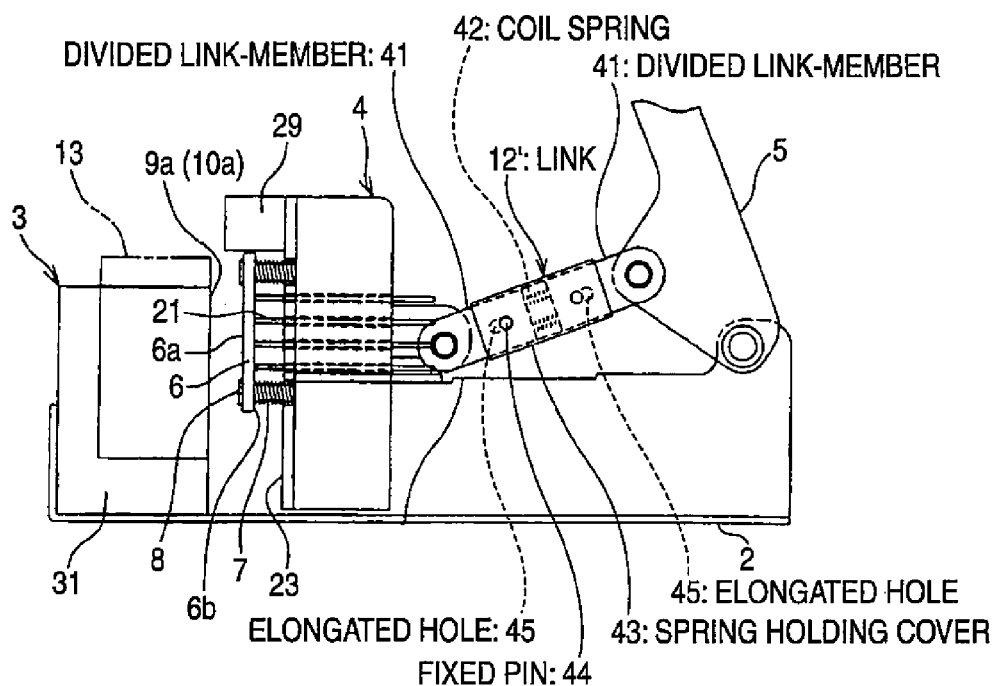
FIGS. 3A and 3B illustrate another embodiment of the inspection pin protection structure of the conduction inspective apparatus according to the invention.
Figure 3B:
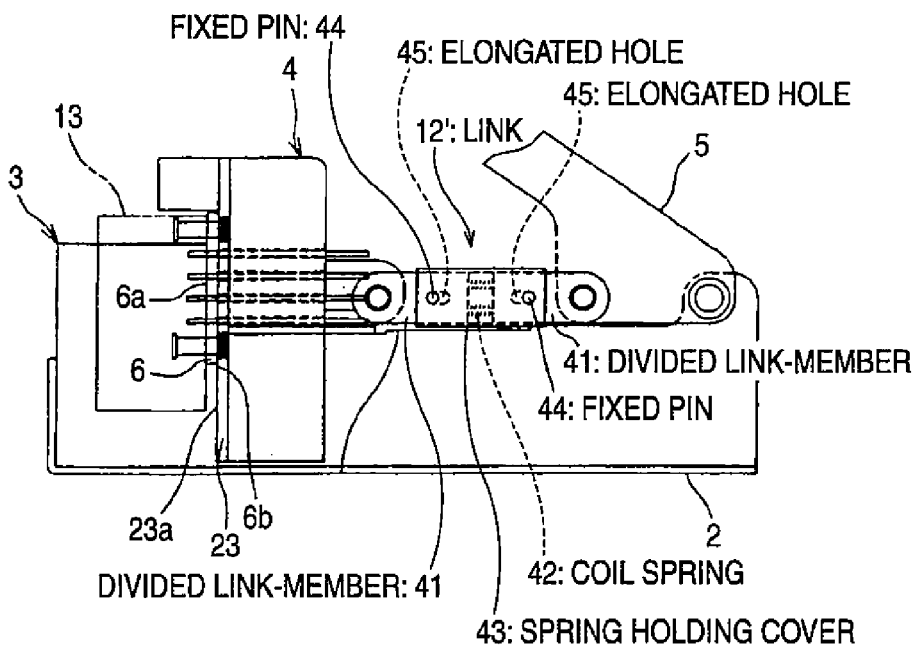
Figure 4A:
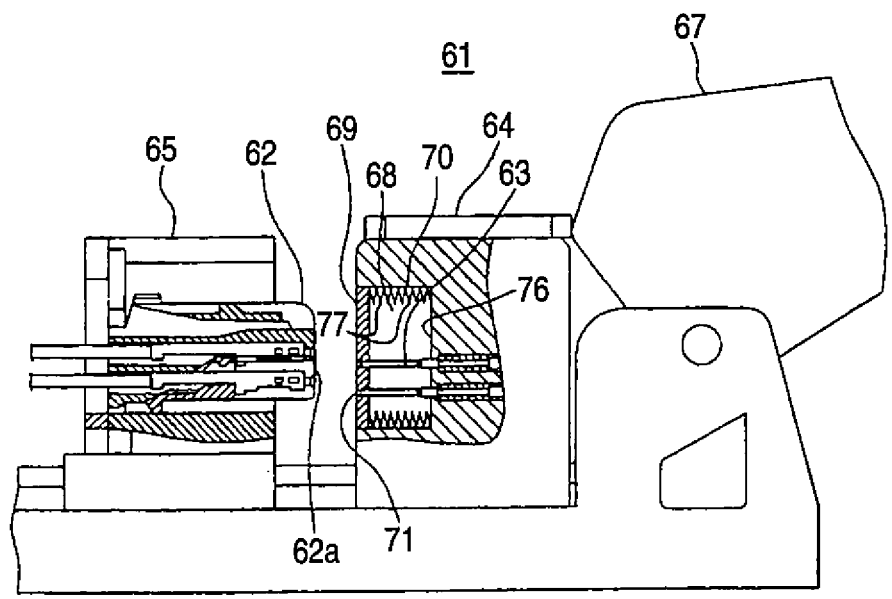
FIGS. 4A and 4B illustrate an example of a conventional conduction check apparatus.
Figure 4B:
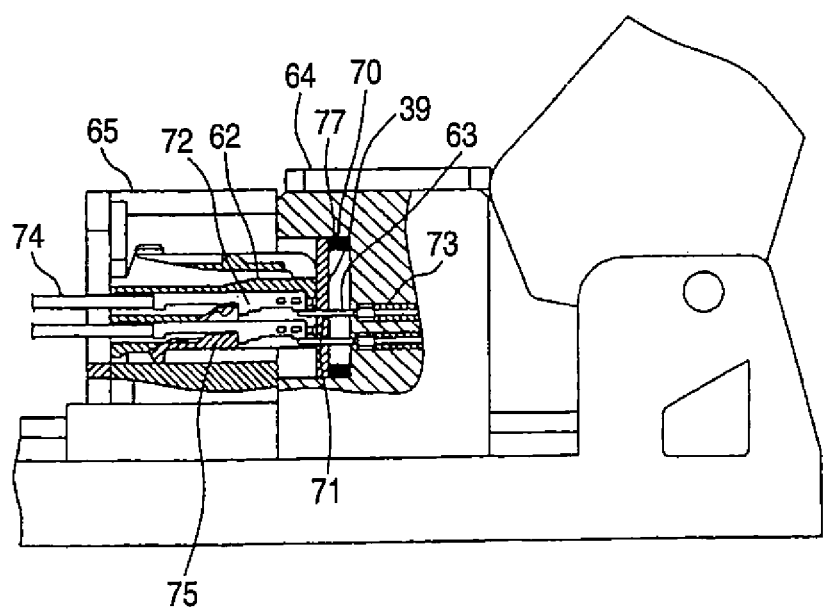

FIGS. 3A and 3B illustrate another embodiment of the inspection pin protection structure of the conduction check apparatus according to the invention.

This structure is such that a displacement absorption mechanism is provided in the movable link 12 of the lever 5 of the aforementioned embodiment illustrated in FIG. 1, and that an excessive compressing force applied to the protection board 6 due to variation in the dimensions of components can be absorbed by the displacement absorption mechanism when the protection board 6 abuts against each of the connector setting part 3 and the inspecting part 4 (i.e., the front end surface 6a of the protection board 6 abuts against the rear end surfaces 9a and 10a of the setting part 3 while the rear end surface 6b thereof abuts against the front end surface 23a of the inspecting part 4) at the conduction check illustrated in FIG. 3B. The rest of this structure is basically similar to that according to the aforementioned embodiment illustrated in FIG. 1. Therefore, similar components are designated with the same reference character. Consequently, the detailed description of such components is omitted.

This displacement absorption mechanism is fundamentally the same as that previously proposed by the applicants of the present application in JP-A-2001-160471 and provides effective advantages by the combination of the protection board 6 and the displacement absorption mechanism.

The displacement absorption mechanism (i.e., the movable link 12') includes a pair of anteroposteriorly divided link-members 41, a pair of upper and lower compressing coil springs 42 elastically provided between the divided link-members 41, and a rectangular cylindrical spring holding cover 43 that holds the coil springs 42 outside the divided link-members 41 and has fixed pins 44 slidably engaging with the elongated holes 45 of the divided link-members 41, respectively.

When the connector 13 is set, as illustrated in FIG. 3A, the lever 5 is rearwardly turned, so that the movable link 12' is frontwardly downwardly inclined. Each pair of divided link-members 41 is spaced apart in the longitudinal direction and is stretched by an urging force of the coil springs 42. The protection board 6 is spaced apart along the guide pins 8 frontwardly from the plate wall 23 at the front end of the inspecting part 4 by the force of the coil springs 7. Thus, the leading end of each of the inspection pins 21 is placed in an associated one of the pin hole 28 (FIG. 1) of the protection board 6. The guide wall 29 of the inspecting part 4 is placed above the protection board 6.

At the conduction inspection of the connector 13 illustrated in FIG. 3B, the lever 5 is frontwardly turned. The inspecting part 4 is advanced towards the setting part 3 while the movable link 12' is horizontally turned. Thus, the front end surface 6a of the protection board 6 abuts against the rear end surfaces 9a and 10a of both the side walls of the setting part 3. The rear end surface 6b of the protection board 6 abuts against the front end surface 23a of the plate wall 23. Thus, the protection board 6 is sandwiched between the setting part 3 and the plate wall 23. Simultaneously with this, the pair of divided link-members 41 move closer to each other by incorporated compressing the coil springs 42. Consequently, the movable link 12' is shortened and is put into a horizontally locked state.

The protection board 6 is sandwiched between the setting part 3 and the plate wall 23. Thus, bending-deformation of the protection board 6 is prevented. Further, the front end surface 6a of the protection board 6 abuts against the rear end surfaces 9a and 10a of the setting part 3. Simultaneously with this, the movable link 12' is compressed (or shortened). Thus, a part of an abutment force acting between the protection board 6 and the setting part 3 is absorbed. Consequently, an excessive compressing force does not act on the protection board 6. Accordingly, compression-deformation or the like of the protection board 6 is prevented. In addition, an operation of turning the lever 5, and the abutment between the protection board 6 and the setting part 3 are performed smoothly and surely. Thus, a conduction inspection of the connector 13 is surely performed.

In a case where the gap between the front end (plate wall) 23 of the inspecting part 4 and each of the rear ends 9a and 10a of the setting part 3 illustrated in FIG. 3A is small, the protection board 6 can be provided at the rear end of the setting part 3, instead of being provided at the front end of the inspecting part 23. In this case, when the plate wall 23 of the inspecting part 4 abuts against the protection board 6 at the side of the setting part 3, the movable link 12' is compressed and displaced. Thus, compressing-deformation of the protection board 6 is prevented. In addition, an operation of turning the lever 5, and the abutment between the protection board 6 and the inspecting part 4 are performed smoothly and surely. Thus, a conduction inspection of the connector 13 is surely performed.

Incidentally, in the embodiment illustrate in FIG. 1, the inspecting part 4 is advanced and retreated using the lever 5 and the link 12. However, instead of the lever 5 and the link 12, e.g., a horizontal air cylinder (not shown) or the like can be used as advance-and-retreat driving means for the inspecting part 4. Additionally, instead of the metal flange plate 16 of the connector setting part 3, a flange portion can be formed integrally with the side wall 10, so that the rear end surface 10a of the flange portion can be made to abut against the protection board 6.

The invention claimed is:

1. A conduction check apparatus for inspecting a connector conduction comprising:
   an inspection part comprising:
      a main body having a surface from which a plurality of inspection pins protrude;
      a guide pin affixed to the front end of the inspection part;
      a protection board attached to the main body that slides along the guide pin from a first position to a second position, the protection board having a plurality of holes;
      wherein the protection board is spring-urged so as to freely move forwardly and backwardly along the guide in from the first position to the second position;
   wherein at the first position, the protection board covers a tip of each of the inspection pins; and
   at the second position, each of the inspection pins protrudes from one of the holes of the protection board; and
   a connector setting part relatively moving toward the inspection part, wherein the protection board moves between the first and the second position during the relative movement.

2. The conduction check apparatus according to claim 1, wherein the connector setting part has a rear end surface facing to the protection board and coming into contact with the protection board during the relative motion.

3. The conduction check apparatus according to claim 2, wherein the connector setting part has a first side wall and a second side wall so as to have a U-shape.

4. The conduction check apparatus according to claim 1, wherein the protection board has a guide hole through which the guide pin is mounted.

5. The conduction check apparatus according to claim 4, wherein the guide pin has a thick portion at a tip of the guide pin, and the thick portion has a larger cross section than other part along which the protection board slides.

6. The conduction check apparatus according to claim 5, wherein the urging member is a spring winding the guide pin.

7. The conduction check apparatus according to claim 6, wherein the surface has a space at a root of the guide pin in which the spring is accommodated at the second position.

8. The conduction check apparatus according to claim 1, wherein the inspection part further comprises a guide wall jutting from the surface.

9. The conduction check apparatus according to claim 8, wherein the protection board has a cutout portion and the guide wall has a projection portion slidably fitting to the cutout portion.

10. The conduction check apparatus according to claim 1, further comprises a lever connected to the inspection part through a divided link, wherein the divided link includes a first link connected to the inspection part, a second link connected to the lever, and an elastic member connecting the first and the second link.

* * * * *